United States Patent
Hirano

(10) Patent No.: US 6,657,898 B2
(45) Date of Patent: Dec. 2, 2003

(54) NONVOLATILE SEMICONDUCTOR MEMORY DEVICE AND DATA ERASE METHOD THEREFOR

(75) Inventor: Yasuaki Hirano, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/325,955

(22) Filed: Dec. 23, 2002

(65) Prior Publication Data

US 2003/0123296 A1 Jul. 3, 2003

(30) Foreign Application Priority Data

Dec. 26, 2001 (JP) ...................................... 2001-394406

(51) Int. Cl.⁷ ............................................. G11C 16/04
(52) U.S. Cl. ............................ 365/185.29; 365/189.07; 365/185.22; 365/185.18
(58) Field of Search ....................... 365/185.29, 185.07, 365/185.22, 185.18

(56) References Cited

U.S. PATENT DOCUMENTS

| | | | |
|---|---|---|---|
| 5,805,501 A | * 9/1998 | Shiau et al. | 365/185.29 |
| 5,831,905 A | 11/1998 | Hirano | 365/185.29 |
| 6,172,911 B1 | * 1/2001 | Tanaka et al. | 365/185.22 |
| 6,320,785 B1 | * 11/2001 | Yoshida et al. | 365/185.03 |
| 6,404,681 B1 | 6/2002 | Hirano | 365/185.33 |
| 6,580,643 B1 | * 6/2003 | Satoh et al. | 365/185.22 |

FOREIGN PATENT DOCUMENTS

| | | |
|---|---|---|
| JP | 06-096592 | 4/1994 |
| JP | 09-320282 | 12/1997 |
| JP | 2001-216788 | 8/2001 |

* cited by examiner

*Primary Examiner*—Richard Elms
*Assistant Examiner*—Tuan T. Nguyen
(74) *Attorney, Agent, or Firm*—Morrison & Foerster LLP

(57) ABSTRACT

This method has a step of performing a write-before-erase operation (S21, S22) and a step of performing an erase operation (S23, S24) for a memory cell. A voltage application condition upon the write-before-erase operation is relaxed in comparison with a voltage application condition upon a usual write operation so that a threshold voltage distribution of memory cells after the write-before-erase operation is substantially different from a threshold voltage distribution of memory cells after the usual write operation. According to this data erase method for a nonvolatile semiconductor memory device, stress applied to each memory cell by the write-before-erase operation can be reduced, and hence reliability of a memory cell can be improved.

6 Claims, 14 Drawing Sheets

NONVOLATILE SEMICONDUCTOR MEMORY DEVICE AND DATA ERASE METHOD THEREFOR

BACKGROUND OF THE INVENTION

The present invention relates to a nonvolatile semiconductor memory device and a data erase method therefor. The nonvolatile semiconductor memory device typically refers to a flash memory.

As shown in FIG. 1, a flash memory cell, which is most commonly used as a nonvolatile semiconductor memory device, includes a source 11 and a drain 12 formed distantly from each other on a substrate (well) 10 surface and a tunnel oxide film 13, floating gate FG, interlayer insulating film 14 and control gate CG successively formed on the substrate 10 between these source and drain.

An operation principle of a flash memory of this type is described below. At the time of a write (also referred to as "program") operation, Vpp (for example, 9 V) is applied to the control gate CG, a standard voltage Vss (for example, 0 V) is applied to the source, and a voltage of 5 V is applied to the drain as shown voltage conditions in the following Table 1. While 5 V is applied to the drain of a cell to which data is actually written, 0 V is applied to the drain of a cell to which data is not written. Consequently, a large amount of current flows in a channel layer, and hot electrons are generated in a portion on the drain side that has a high electric field. These electrons are implanted into the floating gate FG, and a threshold voltage is raised as in a written state distribution shown in FIG. 2.

TABLE 1

Conventional example (1): Applied voltages in each mode

|  | Control gate | Drain | Source | Substrate (well) |
|---|---|---|---|---|
| Write | 9 V | 5 V/0 V | 0 V | 0 V |
| Erase | −9 V | Open | 6 V | 0 V |
| Read | 5 V | 1 V | 0 V | 0 V |

Furthermore, as shown in FIG. 3, at the time of an erase operation, Vnn (for example, −9 V) is applied to the control gate CG, Vpe (for example, 6 V) is applied to the source, electrons are pulled from the floating gate FG to the source side, and a threshold voltage is lowered as in an erased state distribution as shown in FIG. 2. As shown in FIG. 3, a BTBT (Band To Band Tunneling) current flows at the time of this erase operation. When this current is generated, hot holes and hot electrons are generated at the same time. Of these, the hot electrons flow into the drain, but, on the other hand, the hot holes are pulled to the side of the tunnel oxide film and trapped in the tunnel oxide film. It is generally said that this phenomenon deteriorates reliability.

At the time of a read operation, 1 V is applied to the drain, and 5 V is applied to the control gate CG as shown in the voltage conditions in Table 1. Since a current flows into a cell when a threshold voltage of a memory cell is low, that is, in an erased state, data in the memory cell is determined as "1". On the other hand, since a current does not flow into the cell when the threshold voltage of the memory cell is high, that is, in a written state, data of the memory cell is determined as "0".

Write, erase and read operations are performed by using such operation principles, but, in an actual device, an erase operation is performed in relatively large units such as, for example, in units of blocks such as 64 kB (kilobytes). At this time, since some of memory cells in a block from which data is to be erased are in a written state and others are in an erased state, the present applicants has proposed such a method of erasing data as shown in FIG. 4 (Japanese Patent Laid-Open Publication No. 9-320282) so that data can be appropriately erased from these memory cells having different threshold voltages in a batch.

To make a threshold voltage distribution after an erase operation compact and prevent an overerased state (having a threshold voltage of 0 V or lower), first, a usual write operation (write-before-erase operation) is performed by channel hot electrons (S1) as shown in FIG. 4. Consequently, all the cells are once in a written state having a threshold voltage 5 V or higher. At this time, for example, in a device having a power source of 5 V (5-V power source version), 8 memory cells can be operated simultaneously. When write time of one memory cell is 2 μs, time required for this operation is as follows:

$$2\ \mu s \times 64 \times 1024 \times 8/8 = 131\ ms$$

This value accounts for about 20% when time required for execution of all the processing in FIG. 4 (referred to as "total data erase time") is 600 ms.

A voltage required for a write operation is generated by raising a voltage from the power source by using a charge pump circuit. However, since an ability of current supply from the charge pump is lowered in a 3-V power source version, which has a low power source voltage, the number of cells to which data can be simultaneously written is limited in a write method using channel hot electrons with a high write current per cell. While data can be simultaneously written to 8 memory cells in the 5-V power source version, the number of memory cells to which data can be simultaneously written is limited to 4 in the 3-V power source version. Consequently, time required to a write-before-erase operation is twice as long (that is, 262 ms). This problem becomes further marked as the power source voltage is made lower.

Subsequently, whether the write-before-erase operation is normally performed is verified (this operation is referred to as "verify operation after write-before-erase") (S2). That is, whether the threshold voltage of a memory cell is 5.0 V or higher is verified in units of 8 bits. Since this operation is also performed in units of 8 memory cells, about the following time is required.

$$100\ ns \times 64 \times 1024 \times 8/8 = 6.6\ ms$$

Subsequently, an actual erase operation is performed, that is, an erase pulse is applied (S3). At this time, the erase pulse is applied in a batch of blocks. As described above, a BTBT current is generated, and a relatively high current flows. The total time required for this pulse application is about 300 ms, which accounts for about 50% of the total data erase time. Current consumption per cell is about 10 nA even with the addition of the BTBT current since the erase operation is performed by utilizing the FN tunneling phenomenon. Therefore, the following is obtained:

$$10\ nA \times 64 \times 1024 = 10\ nA \times 64\ kB = 5.24\ mA$$

Here, to reduce the erase pulse application time, it is sufficient to raise a voltage applied to the source. However, when the source voltage is raised, the BTBT current is increased, and holes trapped in the tunnel oxide film are increased. As a result, reliability is deteriorated due to the change of the threshold voltage. Accordingly, the source voltage cannot be further raised, and hence reduction of the erase pulse application time is limited.

Finally, whether an erase operation is normally performed is verified (referred to as "verify-after-erase operation") (S4). That is, whether a threshold voltage of memory cell is 3.0 V or lower is verified.

Thus, there are problems in a general flash memory that a) the total data erase time is long and that b) current consumption is high. Causes for the problem a) of the long total data erase time include long time required for a write-before-erase operation performed for all memory cells, long time required for a verify operation after write-before-erase and limited reduction of erase pulse application time. Causes for the problem b) of the high current consumption include very high current consumption of 500 μA as a peak value of a write current per cell since the write-before-erase operation is performed by using channel hot electrons and a flow of the BTBT current, which is allowed at the time of erase pulse application.

Accordingly, there has been proposed a method of writing data to a memory cell having a structure shown in FIG. 1 in a batch by utilizing the FN (Fowler-Nordheim) tunneling phenomenon for the write-before-erase operation (Japanese Patent Laid-Open Publication No. 6-96592 and Patent Application No. 2000-025779). Voltage conditions in each mode used for write, erase, write-before-erase and read operations are shown in the following Table 2 (Patent Application No. 2000-025779).

TABLE 2

Conventional example (2): Applied voltages in each mode

|  | Control gate | Drain | Source | Substrate (well) |
|---|---|---|---|---|
| Write | 9 V | 5 V/0 V | 0 V | 0 V |
| Erase | −9 V | Open | 6 V | 0 V |
| Write-before-erase | 9 V | Open | −7 V | −7 V |
| Read | 5 V | 1 V | 0 V | 0 V |

As shown in Table 2, by applying a positive high voltage (for example, 9 V) to the control gate CG and a negative high voltage (for example, −7 V) to the substrate (well) 10 at the time of a write-before-erase operation, a high electric field is generated between the channel layer of the substrate surface and the floating gate FG, and electrons are implanted from the channel layer into the floating gate FG. In this method, since the FN tunneling phenomenon is utilized for the write-before-erase operation, current consumption per cell is as low as 10 pA. Therefore, data can be simultaneously erased from one block.

In this method, as shown in FIG. 5, when an erase command is inputted, a write-before-erase operation is first performed to make a threshold voltage after the erase operation as compact as possible and prevent an overerased state (S11). In this case, a voltage is applied to a memory cell as shown in the voltage conditions in the write-before-erase mode in Table 2 to perform a write operation utilizing the FN tunneling phenomenon from the channel region, thereby raising the threshold voltage.

Subsequently, a verify operation after write-before-erase is performed (S12). In this case, threshold voltages of memory cells to which data is written and a threshold voltage of a reference cell (having a threshold voltage of 5 V) are compared. If a threshold voltage of even one memory cell to which data is written is 5 V or lower, a pulse is applied again to raise the threshold voltage. When the threshold voltages of all the memory cells are 5 V or higher, pulse application is terminated. Consequently, as shown in FIG. 6, all the cells are once in a written state having a threshold voltage of 5 V or higher.

Subsequently, an actual erase operation is performed, that is, an erase pulse is applied (S13). In this case, as shown in the voltage application conditions in the erase mode in Table 2, a negative voltage (−9 V) is applied to the gate and a positive voltage (6 V) is applied to the source to lower a threshold voltage of a memory cell. Subsequently, a verify-after-erase operation is performed (S14). In this case, threshold voltages of memory cells from which data is erased and a threshold voltage of a reference cell (having a threshold voltage of 3 V) are compared. If a threshold voltage of even one memory cell from which data is erased is 3 V or higher, a pulse is applied again to lower the threshold voltage. When the threshold voltages of all the memory cells in a block are 3 V or lower, pulse application is terminated.

The following Table 4 shows threshold voltages of the reference cells used in the aforementioned verify and read operations.

Meanwhile, as this erase pulse application utilizing the FN tunneling phenomenon, a channel erase operation may be performed instead of the source-side erase operation as described above under voltage conditions shown in Table 3 (a negative voltage of −9 V is applied to the gate and a positive voltage of 7 V is applied to the well).

TABLE 3

Conventional example (3): Applied voltages in each mode

|  | Control gate | Drain | Source | Substrate (well) |
|---|---|---|---|---|
| Write | 9 V | 5 V/0 V | 0 V | 0 V |
| Erase | −9 V | Open | Open | 7 V |
| Write-before-erase | 9 V | Open | −7 V | −7 V |
| Read | 5 V | 1 V | 0 V | 0 V |

TABLE 4

Threshold voltages of reference cells for verify and write operations

|  | Threshold voltage of reference cell |
|---|---|
| Write | 5 V |
| Erase | 3 V |
| Write-before-erase | 5 V |
| Read | 3.5 V |

(The same verify cell is used for write-before-erase and write operations.)

Thus, since a write current per memory cell is low when the FN tunneling phenomenon is utilized for a write-before-erase operation, the number of memory cells to which data can be simultaneously written is significantly increased. Therefore, time required for a write-before-erase operation is significantly reduced, and hence the total data erase time can be made as short as about 20 ms.

However, when a write-before-erase pulse is applied to a memory cell that is already in an erased state before the start of processing for erasing data to make a threshold voltage 5 V or higher, excess stress is applied to the memory cell. Since a data holding characteristic of a flash memory is basically discussed in terms of probability, it is preferable to apply as little stress as possible to the memory cell.

SUMMARY OF THE INVENTION

Accordingly, an object of the present invention is to provide a nonvolatile semiconductor memory device and a data erase method with which stress applied to memory cells by a write-before-erase operation can be reduced to improve reliability of the memory cells.

In order to achieve the above object, a data erase method for a nonvolatile semiconductor memory device formed by arranging in a matrix-like array memory cells constituted by a floating gate field effect transistor to and from which data can be electrically written and erased, having:

a step of performing a write-before-erase operation and a step of performing an erase operation for each memory cell, wherein a voltage application condition upon the write-before-erase operation is relaxed in comparison with a voltage application condition upon a usual write operation so that a threshold voltage distribution of memory cells after the write-before-erase operation is substantially different from a threshold voltage distribution of memory cells after the usual write operation.

The "voltage application conditions" mentioned herein include a pulse width of an applied voltage in addition to an applied voltage value.

Furthermore, the term "write-before-erase" means a write operation after which an erase operation is to be successively performed. The expression "usual write" means a write operation after which an erase operation is not to be successively performed.

In the data erase method for a nonvolatile semiconductor memory device of the present invention, voltage application conditions when a write-before-erase operation is performed are relaxed in comparison with voltage application conditions when a usual write operation are performed so that a threshold voltage distribution of memory cells after the write-before-erase operation is substantially different from a threshold voltage distribution of memory cells after the usual write operation. For example, in the case of a specification in which each memory cell has a high threshold voltage in a written state and a low threshold voltage in an erased state, the voltage application conditions when a write-before-erase operation is performed are relaxed in comparison with the voltage application conditions when a usual write operation is performed so that the threshold voltage distribution of memory cells after the write-before-erase operation is lower than the threshold voltage distribution of memory cells after the usual write operation. In this case, stress applied to each memory cell by the write-before-erase operation can be reduced. Therefore, reliability of memory cells can be improved.

In one embodiment of the present invention, the step of performing a write-before-erase operation and the step of performing an erase operation are performed while referencing a threshold voltage of a reference cell for verifying a write-before-erase operation and a threshold voltage of a reference cell for verifying an erase operation, respectively, to verify a threshold voltage of each memory cell, and the threshold voltage of the reference cell for verifying a write-before-erase operation is set to be the same as the threshold voltage of the reference cell for verifying an erase operation or a threshold voltage of a reference cell for a read operation.

According to this embodiment, a write-before-erase operation and an erase operation are performed while referencing a threshold voltage of a reference cell for verifying a write-before-erase operation and a threshold voltage of a reference cell for verifying an erase operation, respectively, to verify a threshold voltage of each memory cell. Thus, data can be reliably erased, and an overerased state does not occur. Furthermore, the threshold voltage of the reference cell for verifying a write-before-erase operation is set to be the same as the threshold voltage of the reference cell for verifying an erase operation or a threshold voltage of a reference cell for a read operation. Consequently, threshold voltages of a reference cell for verifying a write-before-erase operation and that of the reference cell for verifying an erase operation or the reference cell for a read operation can be made common to prevent the number of reference cells from increasing. Therefore, an area of a chip constituting a nonvolatile semiconductor memory device can be prevented from increasing. Furthermore, since test time for setting a reference cell for verifying a write-before-erase operation is not separately needed, test time can be prevented from increasing.

In one embodiment of the present invention, the write-before-erase operation is performed by utilizing a Fowler-Nordheim phenomenon.

In the data erase method for a nonvolatile semiconductor memory device of this embodiment, since the write-before-erase operation is performed by utilizing the Fowler-Nordheim phenomenon, a write current is lower than when channel hot electrons are used. Therefore, the threshold voltage distribution of memory cells after the write-before-erase operation can be actually made lower than the threshold voltage distribution of memory cells after the usual write operation.

Also, there is provided a nonvolatile semiconductor memory device formed by arranging in a matrix-like array memory cells constituted by a floating gate field effect transistor to and from which data can be electrically written and erased, having:

means for performing a write-before-erase operation for each memory cell to erase data and means for performing an erase operation are included, wherein a voltage application condition used by the means for performing a write-before-erase operation is relaxed in comparison with a voltage application condition used by means for performing a usual write operation so that a threshold voltage distribution of memory cells after the write-before-erase operation is substantially different from a threshold voltage distribution of memory cells after the usual write operation.

The "voltage application conditions" mentioned herein include a pulse width of an applied voltage in addition to an applied voltage value.

Furthermore, the term "write-before-erase" means a write operation after which an erase operation is to be successively performed. The expression "usual write" means a write operation after which an erase operation is not to be successively performed.

A voltage application condition used by the means for performing a write-before-erase operation is relaxed in comparison with a voltage application condition used by means for performing a usual write operation. Consequently, a threshold voltage distribution of memory cells after the write-before-erase operation is substantially different from a threshold voltage distribution of memory cells after the usual write operation.

For example, in the case of a specification in which each memory cell has a high threshold voltage in a written state and a low threshold voltage in an erased state, the voltage application conditions used by a write-before-erase means are relaxed in comparison with the voltage application conditions used by a usual write operation means so that the threshold voltage distribution of memory cells after the write-before-erase operation is lower than the threshold voltage distribution of memory cells after the usual write operation. In this case, stress applied to each memory cell by the write-before-erase operation can be reduced. Therefore, reliability of memory cells can be improved.

In one embodiment of the present invention, the means for performing a write-before-erase operation and the means for performing an erase operation verify a threshold voltage of each memory cell by referencing a threshold voltage of a reference cell for verifying a write-before erase operation and a threshold voltage of a reference cell for verifying an erase operation, respectively, and the threshold voltage of the reference cell for verifying a write-before-erase operation is the same as the threshold voltage of the reference cell for verifying an erase operation or a threshold voltage of a reference cell for a read operation.

In the nonvolatile semiconductor memory device of this embodiment, the means for performing a write-before-erase operation and the means for performing an erase operation perform the write-before-erase and erase operations while verifying a threshold voltage of a memory cell to be processed in reference to a threshold voltage of a reference cell for verifying a write-before-erase operation and that of a reference cell for verifying an erase operation, respectively. Therefore, data can be reliably erased, and an overerased state does not occur. Furthermore, the threshold voltage of the reference cell for verifying a write-before-erase operation is set to be the same as the threshold voltage of the reference cell for verifying an erase operation or a threshold voltage of a reference cell for a read operation. Consequently, threshold voltages of the reference cell for verifying a write-before-erase operation and that of the reference cell for verifying or the reference cell for a read operation can be made common to prevent the number of reference cells from increasing. Therefore, an area of a chip constituting a nonvolatile semiconductor memory device can be prevented from increasing. Furthermore, since test time for setting a reference cell for verifying a write-before-erase operation is not separately needed, test time can be prevented from increasing.

In one embodiment of the present invention, the write-before-erase operation is performed by utilizing a Fowler-Nordheim phenomenon.

In the nonvolatile semiconductor memory device of this embodiment, since the write-before-erase operation is performed by utilizing the Fowler-Nordheim phenomenon, a write current is lower than when channel hot electrons are used. Therefore, the threshold voltage distribution of memory cells after the write-before-erase operation can be actually made lower than the threshold voltage distribution of memory cells after the usual write operation.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereafter, embodiments of the nonvolatile semiconductor memory device and the data erase method of the present invention are described in detail with reference to the accompanying drawings.

(First Embodiment)

Figure 1:
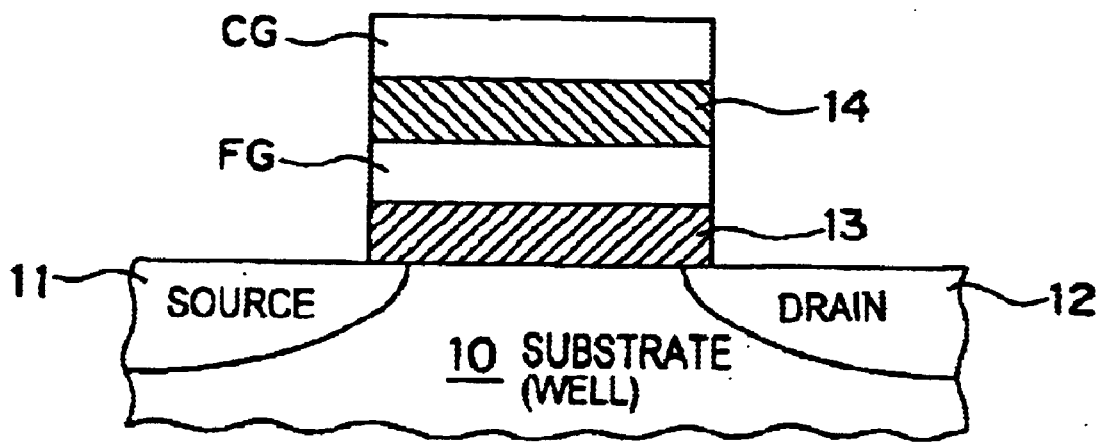
FIG. 1 is a view showing a structure of a general memory cell of a flash memory.
Figure 5:
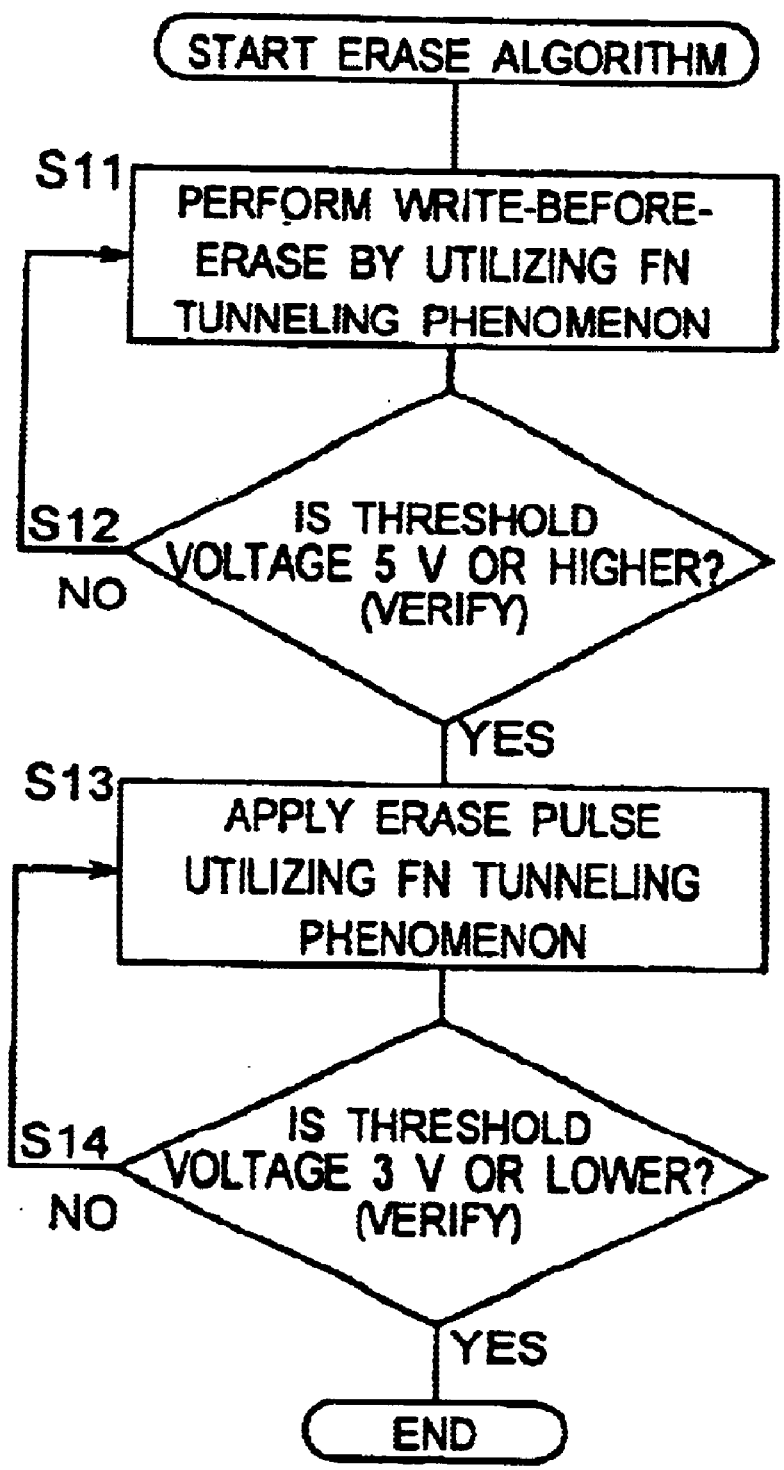
FIG. 5 is a view showing an algorithm of another conventional data erase method of a flash memory.
Figure 6:
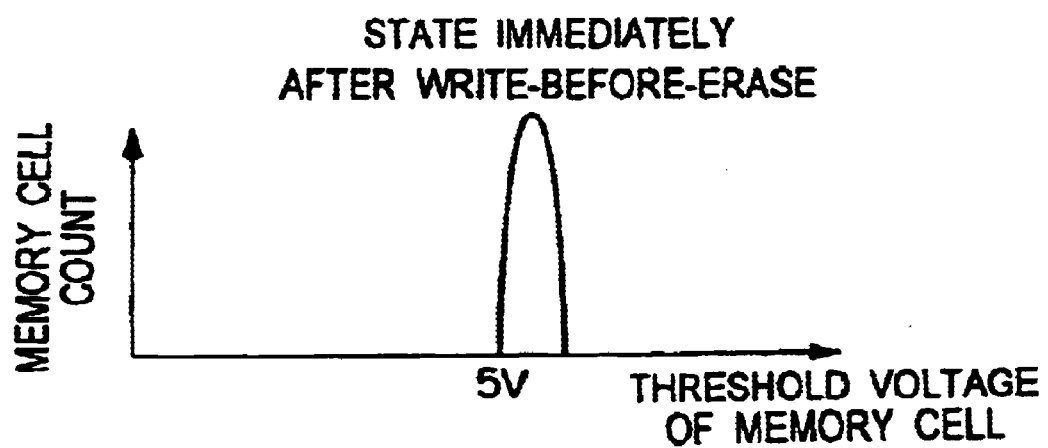
FIG. 6 is a view showing a threshold voltage distribution after a write-before-erase operation by the data erase method in FIG. 5.
Figure 7:
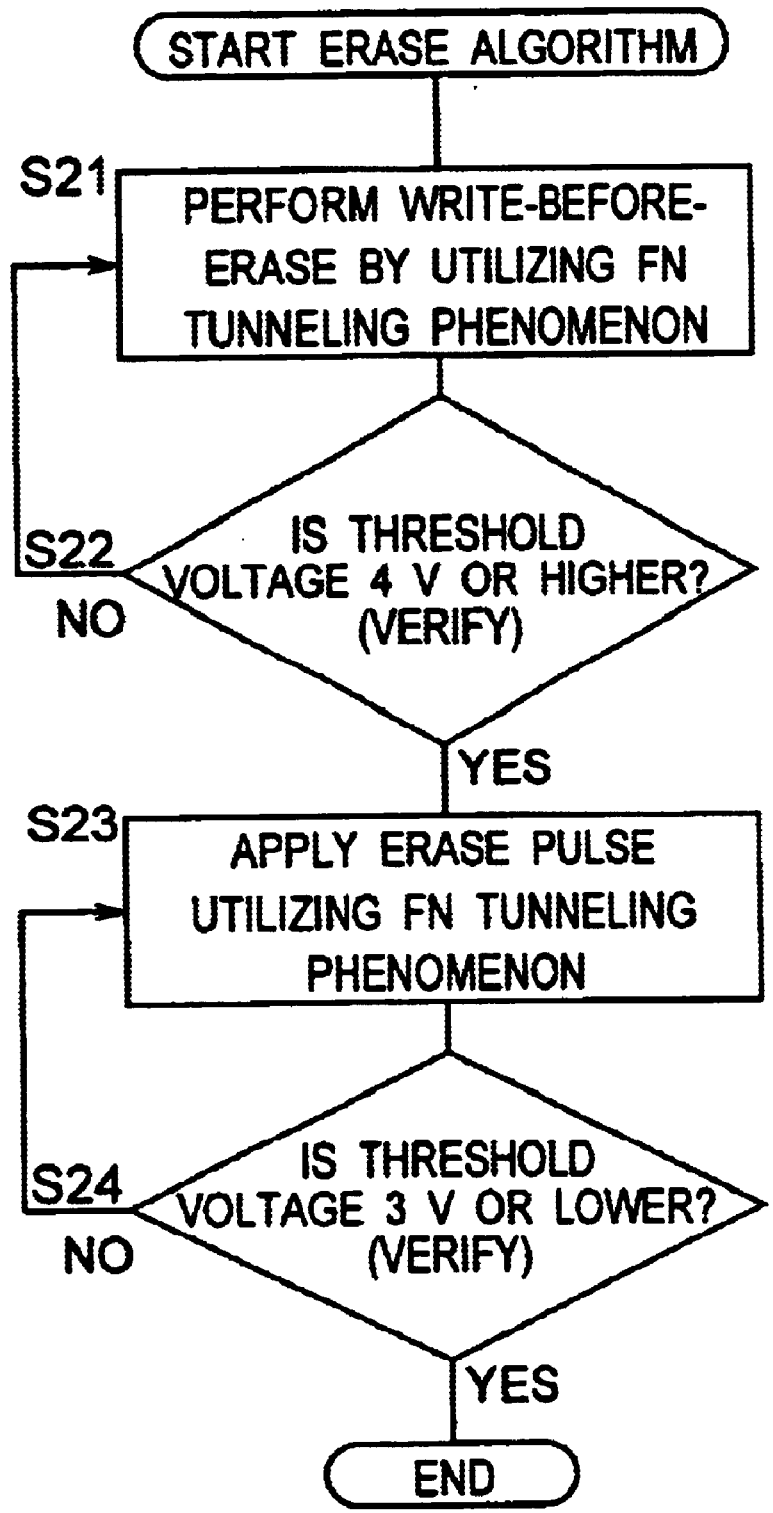
FIG. 7 is a view showing an algorithm of a data erase method for a flash memory according to a first embodiment of the invention.

FIG. 7 shows an algorithm of a data erase method for a nonvolatile semiconductor memory device according to a first embodiment. Generally speaking, in this data erase method, a write-before-erase operation utilizing the FN tunneling phenomenon (S21), verify operation after write-before-erase (S22), erase pulse application utilizing the FN tunneling phenomenon (S23) and verify-after-erase operation (S24) are performed for a flash memory including a memory cell having the structure shown in FIG. 1 as in the data erase method shown in FIG. 5. This data erase method is the same as the data erase method shown in FIG. 5 except that a threshold voltage of a reference cell used in the verify operation after write-before-erase (reference cell for verifying a write-before-erase operation) is different from a threshold voltage (5 V) of a reference cell used in a usual verify-after-write operation. The following Table 5 shows threshold voltages of reference cells used in verify and read operations. As shown in Table 5, the threshold voltage of the reference cell for verifying a write-before-erase operation is set to be 4 V, which is lower than the threshold voltage (5 V) of the reference cell in the usual verify-after-write operation.

TABLE 5

Threshold voltages of reference cells for verify and write operations

| | Threshold voltage of reference cell |
|---|---|
| Write | 5 V |
| Erase | 3 V |
| Write-before-erase | 4 V |
| Read | 3.5 V |

Specifically, first a write-before-erase operation is performed to prevent an overerased state by making a threshold voltage after the erase operation as compact as possible when an erase command is inputted (S21). In this case, voltages are applied to a memory cell as shown in the voltage conditions in the write-before-erase mode in Table 2. That is, 9 V is applied to a control gate CG, and −7 V is applied to a substrate (well). Consequently, a write operation utilizing the FN tunneling phenomenon from a channel region is performed to increase a threshold voltage.

Figure 8:
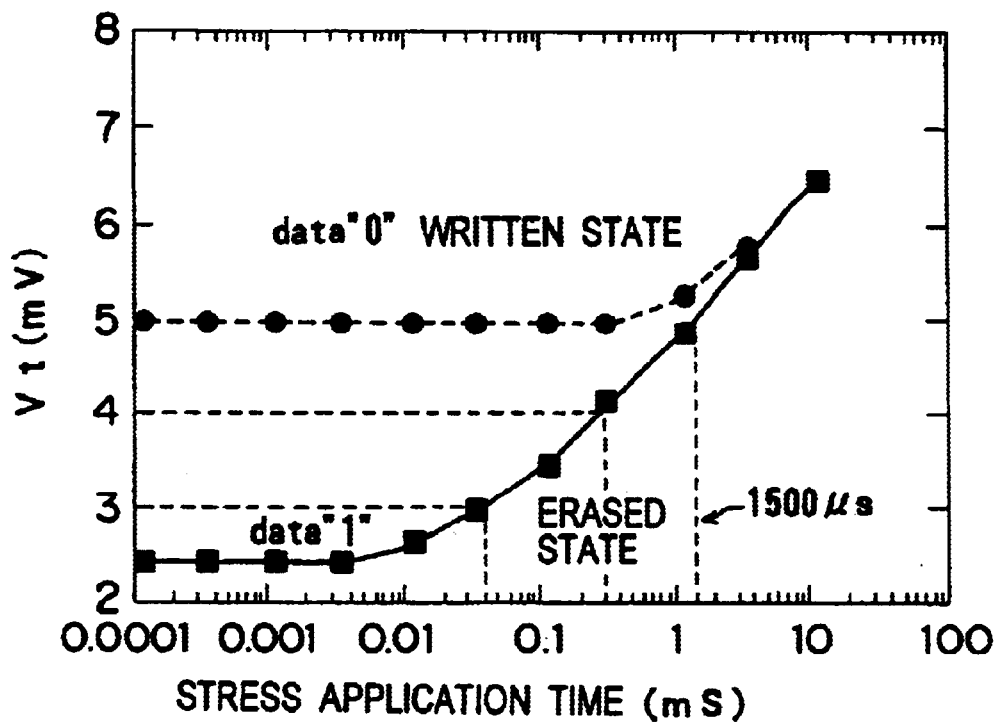
FIG. 8 is a view showing changes in threshold voltages of a memory cell to which a write-before-erase pulse is applied by the data erase method in FIG. 7.

Here, a pulse width used in this write-before-erase operation is 100 $\mu$s. FIG. 8 shows a change in a threshold voltage Vt (m V) of a typical memory cell by write-before-erase pulse application (write characteristic). In FIG. 8, total pulse application time is represented as stress application time along a horizontal axis. As shown in FIG. 8, a threshold voltage of the typical memory cell exceeds 4 V when the total pulse application time (stress application time) becomes 300 $\mu$s. Since a memory cell having a slow write characteristic is considered to operate about 5 times as slowly as the typical memory cell, 300 $\mu$s×5 times=1500 $\mu$s That is, a write-before-erase operation finishes with about 15 pulses.

Figure 9:
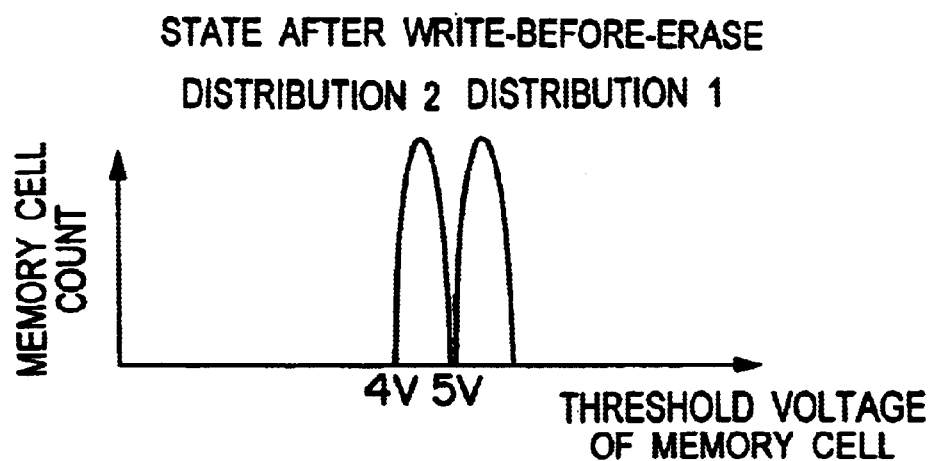
FIG. 9 is a view showing a threshold voltage distribution after a write-before-erase operation by the data erase method in FIG. 7.

FIG. 9 shows a threshold voltage distribution of memory cells after this write-before-erase operation. As shown in FIG. 9, memory cells having a threshold voltage of 5–6 V by a usual write operation (distribution 1 in FIG. 9) and memory cells having a threshold voltage of 4–5 V by this write-before-erase operation (distribution 2 in FIG. 9) are mixed in a block.

Subsequently, a verify operation after write-before-erase is performed (S22). In this case, a threshold voltage of a memory cell to which data is written and a threshold voltage (4 V) of a reference cell for verifying a write-before-erase operation are compared. If a threshold voltage of even one memory cell to which data is written is 4 V or lower, a pulse is applied again to increase the threshold voltage. When the threshold voltages of all the memory cells become 4 V or higher, the pulse application is terminated.

Subsequently, an actual erase operation is performed, that is, an erase pulse is applied (S23). In this case, as shown in the voltage application conditions in the erase mode in Table 2, a negative voltage (−9 V) is applied to the gate, and a positive voltage (6 V) is applied to the source to lower a threshold voltage of the memory cell. Subsequently, a verify-after-erase operation is performed (S24). In this case, a threshold voltage of a memory cell from which data is erased and a threshold voltage (3 V) of a reference cell for verifying an erase operation are compared. If a threshold voltage of even one memory cell from which data is erased is 3 V or higher, a pulse is applied again to lower the threshold voltage. When the threshold voltages of all the memory cells become 3 V or lower, the pulse application is terminated.

Figure 2:
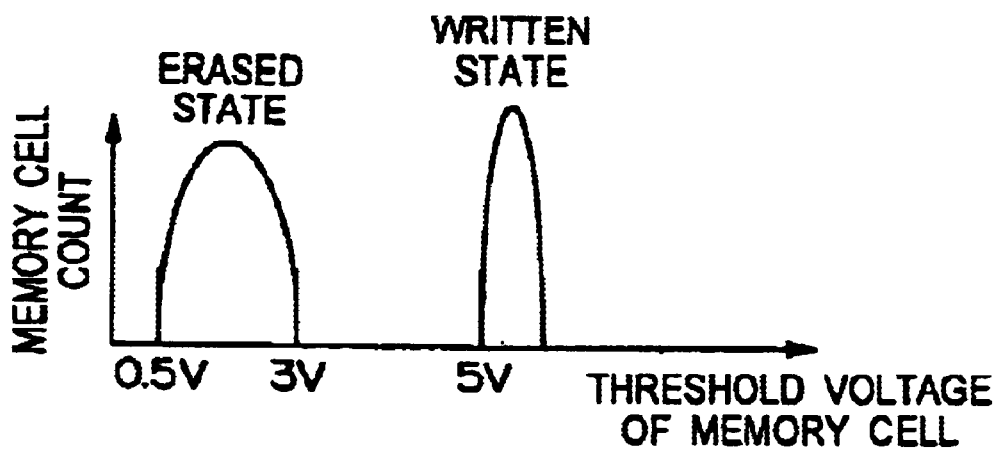
FIG. 2 is a view showing threshold voltage distributions in a written state and an erased state in the general flash memory.
Figure 3:
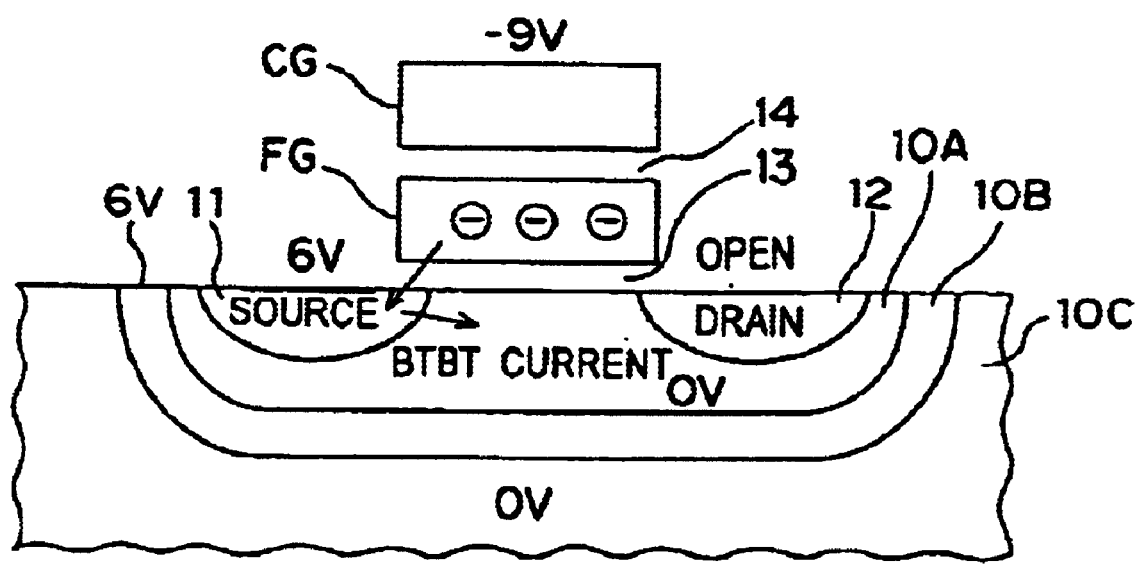
FIG. 3 is a schematic view showing a bias method at the time of an erase operation.
Figure 4:
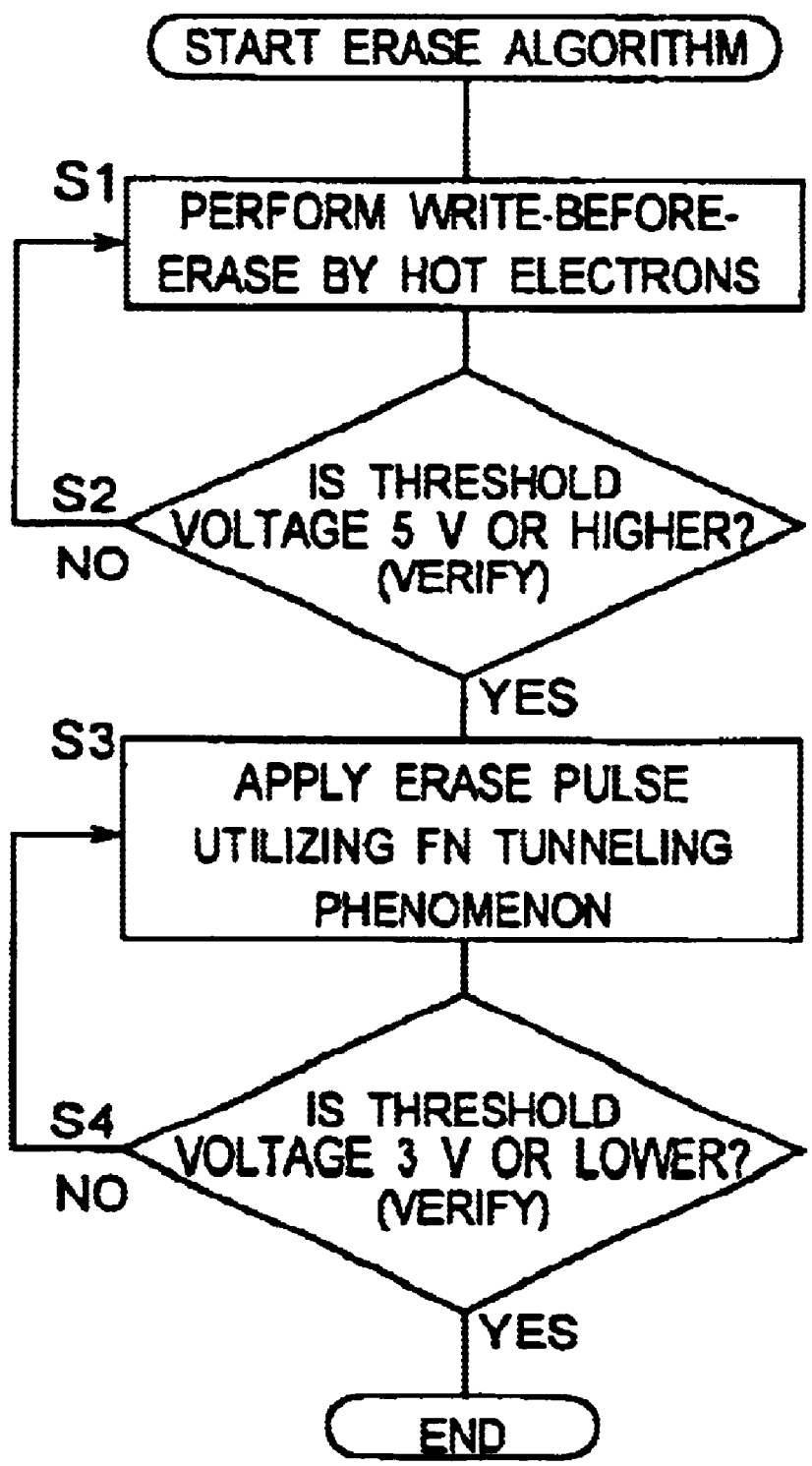
FIG. 4 is a view showing an algorithm of a conventional data erase method of a flash memory.
Figure 10:
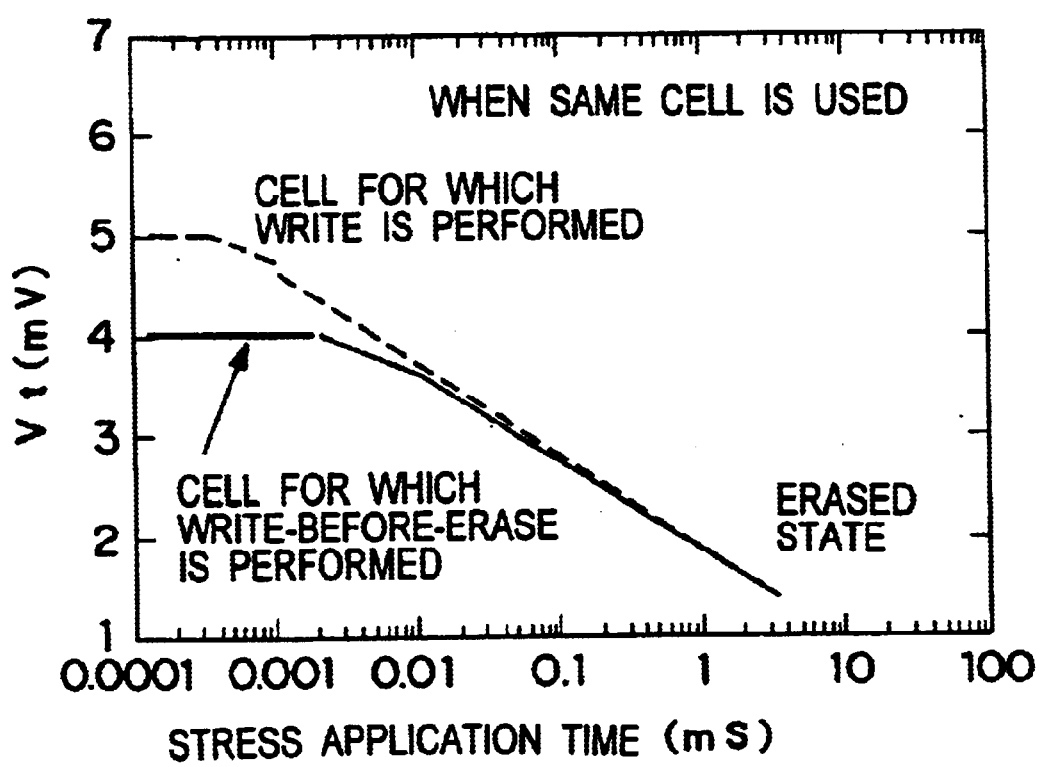
FIG. 10 is a view showing change characteristics of threshold voltages of a memory cell to which an erase pulse is applied by the data erase method in FIG. 7.

Here, a pulse width used in this erase operation is 100 $\mu$s. FIG. 10 shows a change in a threshold voltage Vt (m V) of a typical memory cell by this erase pulse application (erase characteristic). In FIG. 10, total pulse application time is represented as stress application time along a horizontal axis. As shown in FIG. 10, when there are cases where a threshold voltage before this erase pulse application is 4 V and 5 V in the same memory cell, these threshold voltages become closer to each other while lowering as the total pulse application time increases. When the total pulse application time becomes about 0.05 ms, the threshold voltages become about the same. Consequently, when the characteristic after the erase pulse application matches the erased state distribution in shown in FIG. 2, and the verify operations after the erase pulse application and the verify-after-erase operation (S23, S24) are completed, the threshold voltages of all the memory cells become 3 V or lower. Therefore, data can be reliably erased by this data erase method, and an overerase state does not occur.

As described above, since, in this data erase method, a write-before-erase operation is performed under a condition that a threshold voltage after this write-before-erase operation is lower than the threshold voltage (5 V) after a usual write operation, that is, a relaxed condition (condition that a threshold voltage becomes about 4 V) in comparison with a conventional condition, stress applied by the write-before-erase operation can be reduced. Therefore, reliability of a nonvolatile semiconductor memory device can be improved. In addition to this, data can be reliably erased, and an overerased state does not occur.

Figure 14:
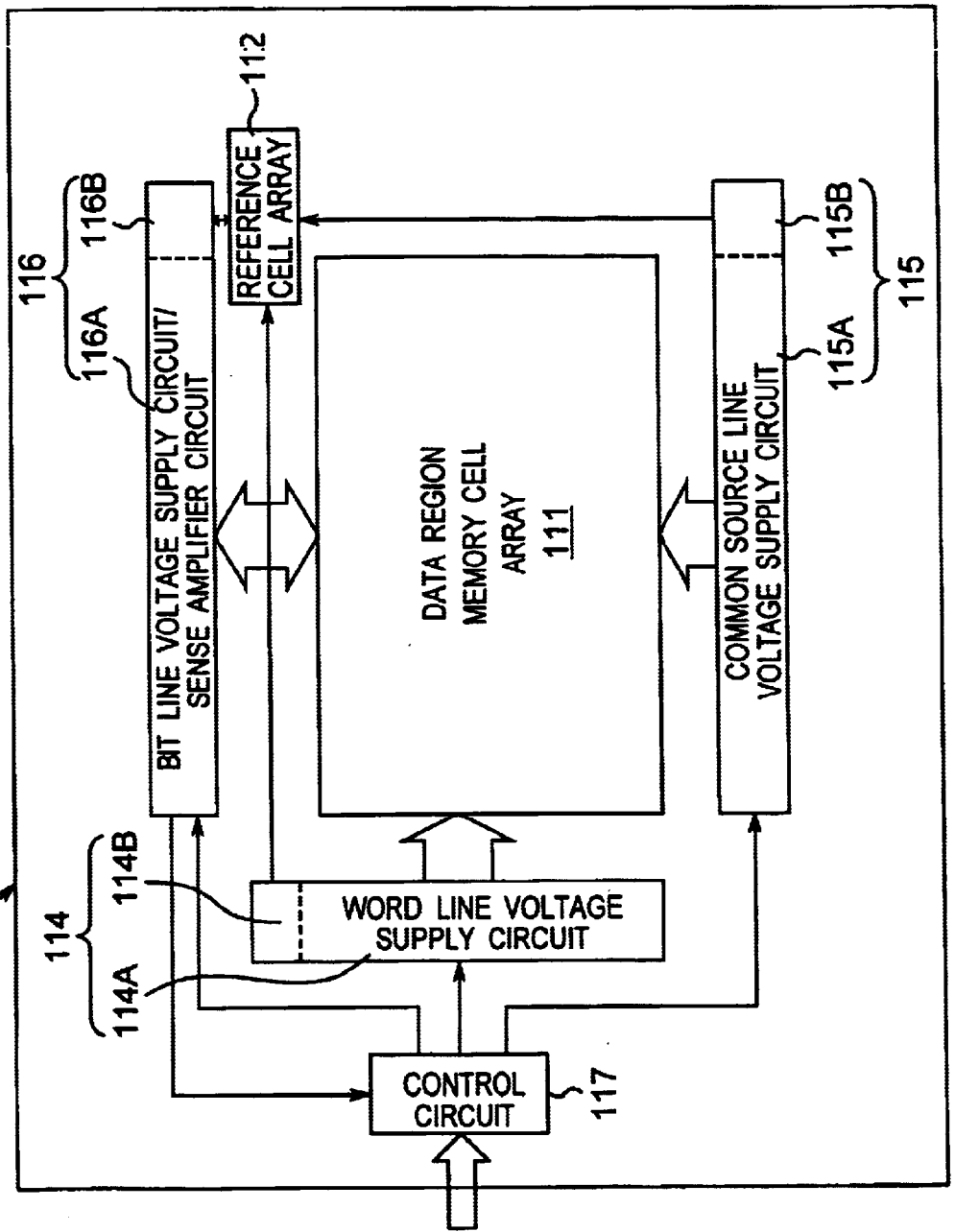
FIG. 14 is a view showing a schematic configuration of a flash memory using the data erase methods according to the first and second embodiments of the invention.

FIG. 14 shows a main circuit block of a flash memory 110 according to one embodiment. A flash memory is constituted at least by a memory cell array (data region) 111 for storing original data and a reference cell array 112 (reference cell for verifying a write operation, reference cell for verifying an erase operation, reference cell for a read operation and so forth).

Figure 15:
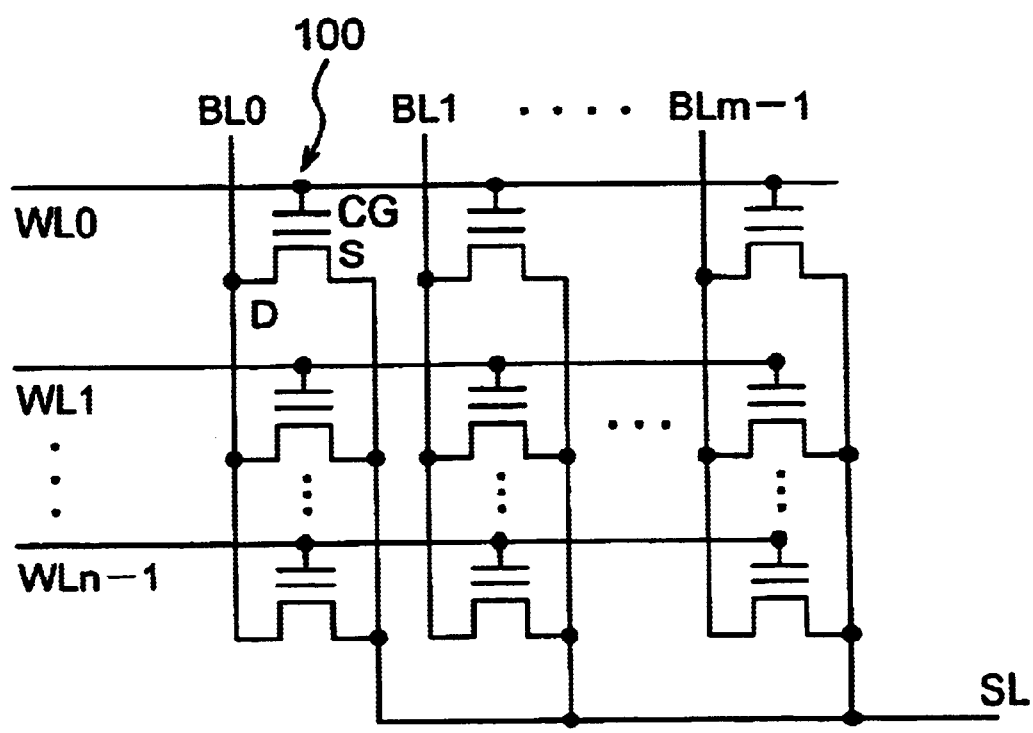
FIG. 15 is a view showing a configuration of a memory cell array (one block) in the flash memory.

FIG. 15 shows one example of one-block array in the memory cell array (data region) 111. As with a general flash memory, a plurality of such blocks aggregate and constitute a memory cell array 111. In the block, memory cells constituted by a floating gate transistor are arranged in a matrix, and control gates CG of m memory cells are connected to a word line WL0. Word lines WL1 to WLn-1 have similar connections. Furthermore, drains of n memory cells are connected to a bit line BL0. Bit lines BL1 to BLm-1 have similar connections. Memory cells in the same block commonly share a source S and are connected to a common source line SL.

As shown in FIG. 14, a word line voltage supply circuit 114A for a data region memory cells is provided to drive a word line WL. The word line voltage supply circuit 114A selects a word line based on a control signal and an address signal from a control circuit 117 and increases voltages to the voltages shown in Table 2 or 3 to drive the word line. Furthermore, to drive a common source line SL, a common source line voltage supply circuit 115A for data region memory cells selects a common source line SL for sharing a source in the same block based on a control signal and an address signal-from the control circuit 117 and increases voltages to the voltages shown in Table 2 or 3 to drive the common source line SL.

Basically, the reference cell array 112 and a memory cell array for data protection are also constituted by the same cells as in the data region memory cell array 111. A word line voltage supply circuit 114B and a source line voltage supply circuit 115B are also provided for the reference cell array 112. These word line voltage supply circuit 114B and source line voltage supply circuit 115B increase voltages to the voltages shown in Table 2 or 3 based on a control signal from the control circuit 117 to drive each line.

Furthermore, a bit line voltage supply circuit/sense amplifier circuit 116A selects a bit line in the data region memory cell array 111 based on a control signal and an address signal from the control circuit 117 and increases voltages to the voltages shown in Table 2 or 3 to drive the bit line, compares a current that flows in the bit line upon a write, erase or read operation with a current that flows in a separately disposed reference cell for verifying a write, erase or read operations in the reference cell array 112, determines the result by a sense amplifier circuit and performs a verify or data read operation. Basically, the word line voltage supply circuit 114B, source line voltage supply circuit 115B and bit line voltage supply circuit/sense amplifier circuit 116B for driving the reference cell array 112 also have the same circuit configuration as that of the aforementioned word line voltage supply circuit 114A, source line voltage supply circuit 115A and bit line voltage supply circuit/sense amplifier circuit 116A for driving the data region memory cell array 111.

Figure 16:
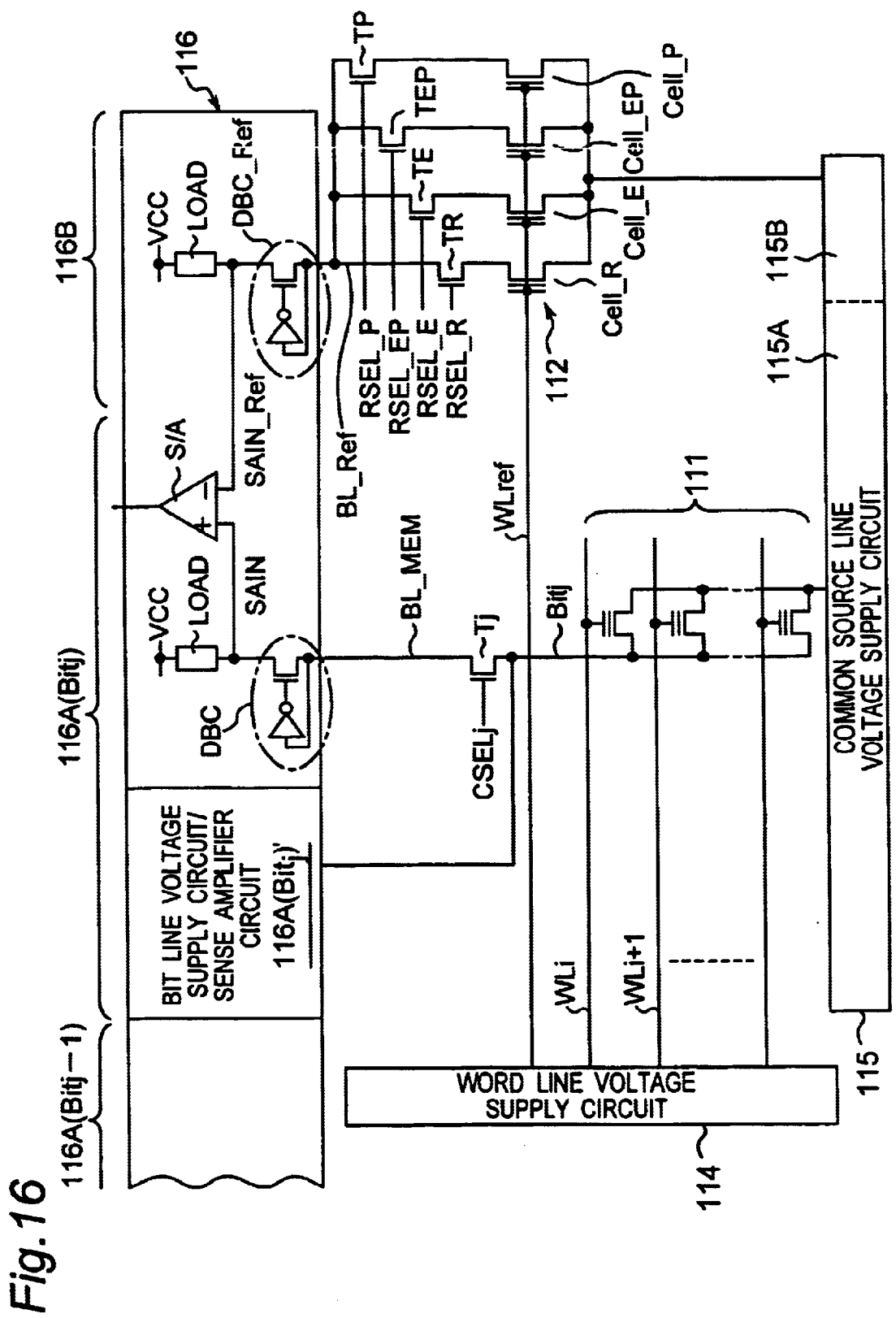
FIG. 16 is a schematic view showing a bit line voltage supply circuit/sense amplifier circuit of a flash memory suitable for using the data erase method according to the first embodiment.

FIG. 16 is a schematic view showing a configuration of a bit line voltage supply circuit/sense amplifier circuit 116 (including 116A and 116B) and a reference cell array 112 suitable for using the data erase method according to the first embodiment. FIG. 16 shows a sense amplifier circuit 116A (Bitj) for one bit line corresponding to data region memory cells for one bit line Bitj and the reference cell array 112 in detail. It is noted that 116A (Bitj)' represents a bit line voltage supply circuit for the one bit line.

The reference cell array 112 includes a reference cell Cell_R for a read operation, reference cell Cell_P for verifying a write operation, reference cell Cell_E for verifying an erase operation and reference cell Cell_EP for verifying a write-before-erase operation. These reference cells are commonly used as those for other bit lines omitted in this figure. A control gate CG is shared by these reference cells and connected to the word line voltage supply circuit 114 (114B in FIG. 14) as a word line WLref. Meanwhile, a source line is shared by these reference cells and connected to the aforementioned common source line voltage supply circuit 115B. A threshold voltage value of each reference cell is set as shown in Table 5 by writing data beforehand.

In this embodiment, a reference cell Cell_EP for verifying a write-before-erase operation is provided, and its threshold voltage is set to be lower (4 V) than a threshold voltage (5 V) of the Cell_P. A write-before-erase operation is verified by comparing a current that flows in this reference cell Cell_EP for verifying a write-before-erase operation and a current that flows in a memory cell in a data region to be verified to determine whether a write pulse should be further applied, and a write pulse is applied so that threshold voltages of the memory cells in the data region to be verified become 4 V or higher. Voltage for applying the write-before-erase pulse are set, for example, as shown in Table 3, and a channel write operation utilizing the FN tunneling phenomenon is performed for all memory cells from which data is to be erased (in units of blocks). As the write-before-erase pulse, a positive high voltage (for example, 9 V) is applied to all word lines from which data is erased (in units of blocks), a bit line is opened, a standard voltage (for example, −7 V) is applied to the source, and a negative voltage (for example, −7 V) is applied to a P-type substrate (well). Consequently, since electrons are implanted from a channel layer to a floating gate FG via a tunnel oxide film due to the FN tunneling phenomenon, a threshold voltage of a memory cell is increased.

After a write-before-erase pulse is once applied, a verify operation after write-before-erase is performed. In the verify operation after write-before-erase, to select a bit line (Bitj in FIG. 16) to which a memory cell to be verified is connected, a bit line selection signal CSELj is set at a high level to turn on a bit line selection transistor Tj. Other bit line selection transistors which do not perform a verify operation are turned off (here, 1 bit is used for simple explanation although the verify operation is performed in units of 8 bits). To verify a threshold voltage of a memory cell, the voltage is compared with a threshold voltage (for example, 4.0 V) of a reference memory cell Cell_EP for verifying a write-before-erase operation, whose voltage is a predetermined threshold voltage beforehand since data is written. To turn on a MOS transistor Tep connected to the reference cell Cell_EP for verifying a write-before-erase operation, the selection signal RSEL_EP is set at a high level to select the Cell_EP. A positive voltage (for example, 5 V) is applied to a word line WLref for a reference cell and a word line WLi, to which a control gate CG of the memory cell to be verified is connected. Furthermore, in a bit line connected to a data region memory cell and the reference cell, voltages at nodes BL_MEM and BL_Ref connected to the memory cell are restricted to be 1 V or lower by a drain bias circuit DBC and a drain bias reference circuit DBC_Ref upon a verify operation (read operation) in consideration to disturbance to the memory cell. Then, a current is supplied from the power source Vcc to the memory cell to be verified and the reference cell Cell_EP for verifying a write-before-erase operation via a load circuit LOAD disposed in both the data region memory cell and the reference cell. In a memory cell selected in the data region memory cell array 111, a current is allowed to flow depending on whether it is in a written or erased state. Here, when a threshold voltage of the selected data region memory cell is 4.0 V or higher, the current that flows in the node BL_MEM becomes lower than the current that flows in the node BL_Ref on the reference cell side. This difference in the current values is converted to the difference in voltage values in nodes SAIN and SAIN_Ref at an input stage of a sense amplifier S/A and inputted into the sense amplifier S/A. In this case, VSAIN becomes a voltage higher than VSAIN_Ref due to the decrease in the voltages by the load circuit LOAD. Therefore, the sense amplifier S/A outputs a high level "1" (identifies data of the memory cell as "0"). When threshold voltages of all memory cells from which data is to be erased (in units of blocks) are determined to be 4.0 V or higher, the write-before-erase operation is completed. On the other hand, VSAIN becomes a voltage lower than VSAIN_Ref due to the decrease in the voltages by the load circuit LOAD when the threshold voltage of the memory cell selected in the data region memory cell array 111 is 4.0 V or lower. Therefore, the sense amplifier S/A outputs a low level "0" (identifies data of the memory cell as "1"). When a low level is detected from the output of the sense amplifier, it is determined that not all memory cells are in a written state before an erase operation yet, and a write-before-erase pulse is applied again. Then, a verify operation is performed again. Until threshold voltages of all memory cells from which data is to be erased become 4.0 V or higher, the write-before-erase pulse application and the verify operation are alternately repeated.

When the write-before-erase operation is completed, an erase pulse is applied. In an erase operation, a negative voltage (for example, −9 V) is applied to all word lines (in units of blocks) from which data is to be erased, the drain and the source are made open, and a positive high voltage (for example, 7 V) is applied to the P-type substrate (well). Consequently, since electrons are released from the floating gate FG to the channel layer via the tunnel oxide film due to the FN tunneling phenomenon, a threshold voltage of a memory cell is lowered. A verify operation for verifying an erased state is performed by selecting a reference cell Cell_E (having a threshold voltage of 3.0 V) and comparing a current that flows in a memory cell to which an erase pulse is applied and a current that flows in the reference cell Cell_E as with the aforementioned write-before-erase operation. Then, erase pulse application and a verify-after-erase operation are repeated until threshold voltages of all data region memory cells (in units of blocks) from which data is to be erased become 3.0 V or lower, and then the operations are finished.

(Second Embodiment)

As described above, in the first embodiment, a flash memory cell for which a threshold voltage is set to be 4 V beforehand is used as a reference cell for verifying a write-before-erase operation. However, in view of application to an actual device, it is not desirable to newly add a reference cell having a different threshold voltage. This is because such problems arise that test time is extended to set the threshold voltage to be 4 V and so forth.

Accordingly, in this second embodiment, the same reference cell as a reference cell for verifying an erase operation is used as a reference cell for verifying a write-before-erase operation. The following Table 6 shows threshold voltages of reference cells.

TABLE 6

Threshold voltages of reference cells for verify and read operations

| | Threshold voltages of reference cells |
|---|---|
| Write | 5 V |
| Erase | 3 V |
| Write-before-erase | 3 V |
| Read | 3.5 V |

Figure 11:
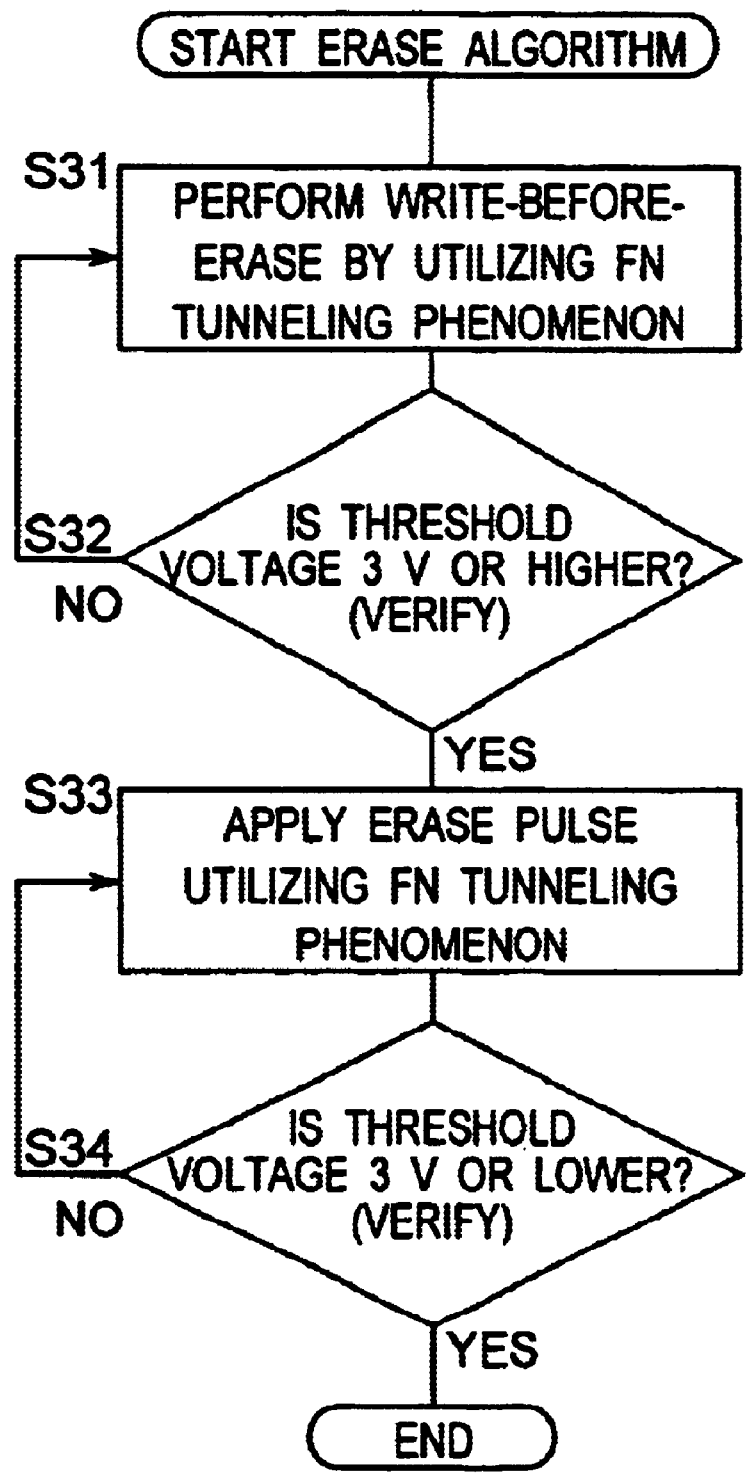
FIG. 11 is a view showing an algorithm of a data erase method for a flash memory according to a second embodiment of the invention.

FIG. 11 shows an algorithm of the data erase method in this case. Generally speaking, in this data erase method, a write-before-erase operation utilizing the FN tunneling phenomenon (S31), verify operation after write-before-erase (S32), erase pulse application utilizing the FN tunneling phenomenon (S33) and verify-after-erase operation (S34) are performed for a flash memory having memory cells with the structure shown in FIG. 1. This data erase method is characterized in that a threshold voltage of a reference cell for verifying a write-before-erase operation is set to be 3 V unlike the threshold voltage (4 V) of the reference cell for verifying a write-before-erase operation in the first embodiment.

Specifically, in the write-before-erase operation (S31), when total pulse application time (stress application time) becomes 40 μs, a threshold voltage of a typical memory cell exceeds 3 V as shown in FIG. 8. Since a memory cell having a slow write characteristic is considered to operate about 5 times as slowly as the typical memory cell, a write-before-erase operation is finished after 40 μs×5 times=200 μs, that is, after a pulse is applied about twice under a condition, in which a pulse width is 100 μs as in the first embodiment.

When the write operation is performed too fast and the threshold voltage becomes too high, the pulse-applied voltage may be lowered to, for example, −9 V for the gate voltage, 7 V for the substrate (well) voltage and so forth.

Figure 12:
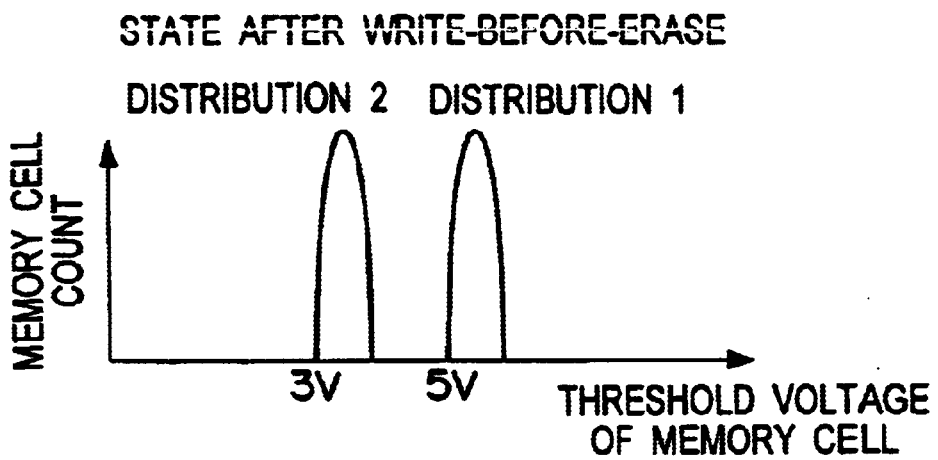
FIG. 12 is a view showing a threshold voltage distribution after a write-before-erase operation by the data erase method in FIG. 11.

When the write-before-erase operation and the verify operation after write-before-erase (S31, S32) are completed, a threshold voltage distribution of the memory cells becomes as shown in FIG. 12. That is, memory cells having a threshold voltage 5–6 V by a usual write operation (distribution 1 in FIG. 12) and memory cells having a threshold voltage of 3–4 V by this write-before-erase operation (distribution 2 in FIG. 12) are mixed in a block.

Figure 13:
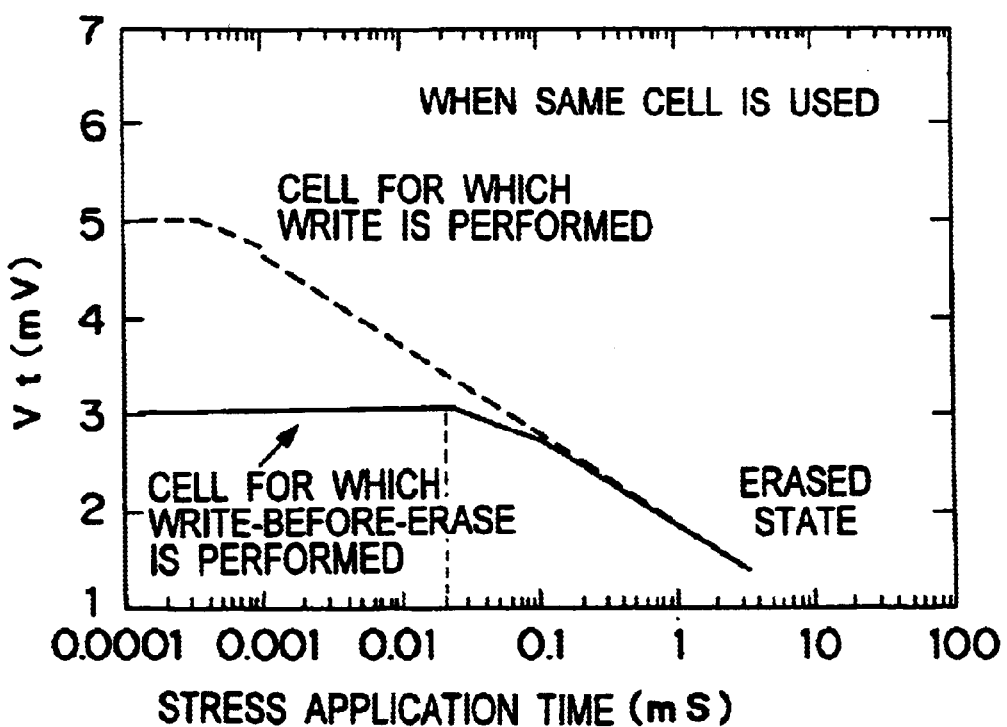
FIG. 13 is a view showing change characteristics in threshold voltages of a memory cell to which an erase pulse is applied by the data erase method in FIG. 11.

FIG. 13 shows changes (erase characteristic) in threshold voltages Vt (mV) of a typical memory cell by the erase pulse application (S33). In FIG. 13, the total pulse application time is represented as stress application time along a horizontal axis. As shown in this FIG. 13, when the threshold voltages of the same memory cell before this erase pulse application are 3 V and 5 V, the threshold voltages become closer while lowering as the total pulse application time increases. When the total pulse application time becomes about 0.1 ms, the threshold voltages become about the same. Consequently, when the characteristic after the erase pulse application matches the erased state distribution shown in FIG. 2, and the erase pulse application and the verify-after-erase operation (S33, S34) are completed, threshold voltages of all memory cells become 3 V or lower. Therefore, data can be reliably erased by this data erase method, and an overerased state does not occur.

As described above, in this data erase method, since the write-before-erase operation is performed under a condition under which a threshold voltage after the write-before-erase operation becomes lower than a threshold voltage (5 V) after a usual write operation, that is, under a more relaxed condition (condition that a threshold voltage becomes about 3 V) in comparison with a conventional condition, stress applied due to the write-before-erase operation can reduced. Therefore, reliability of the nonvolatile semiconductor memory device can be improved. In addition, data can be reliably erased, and an overerased state does not occur. Furthermore, test time for setting a reference cell for verifying a write-before-erase operation is not increased.

As the reference cell for verifying a write-before-erase operation, the same reference cell as a reference cell for a read operation may be used instead of a reference cell for verifying an erase operation. A threshold voltage of the reference cell for verifying a write-before-erase operation in this case becomes 3.5 V, which is the same as the threshold voltage of the reference cell for a read operation. Accordingly, the threshold voltage of a memory cell after the write-before-erase operation (distribution 2 in FIG. 12) is shifted to about 3.5–4.5 V. However, when the characteristic after the erase pulse application matches the erased state distribution shown in FIG. 2, and the erase pulse application and the verify-erase operation (S33, S34) are completed, threshold voltages of all memory cells become 3 V or lower.

Figure 17:
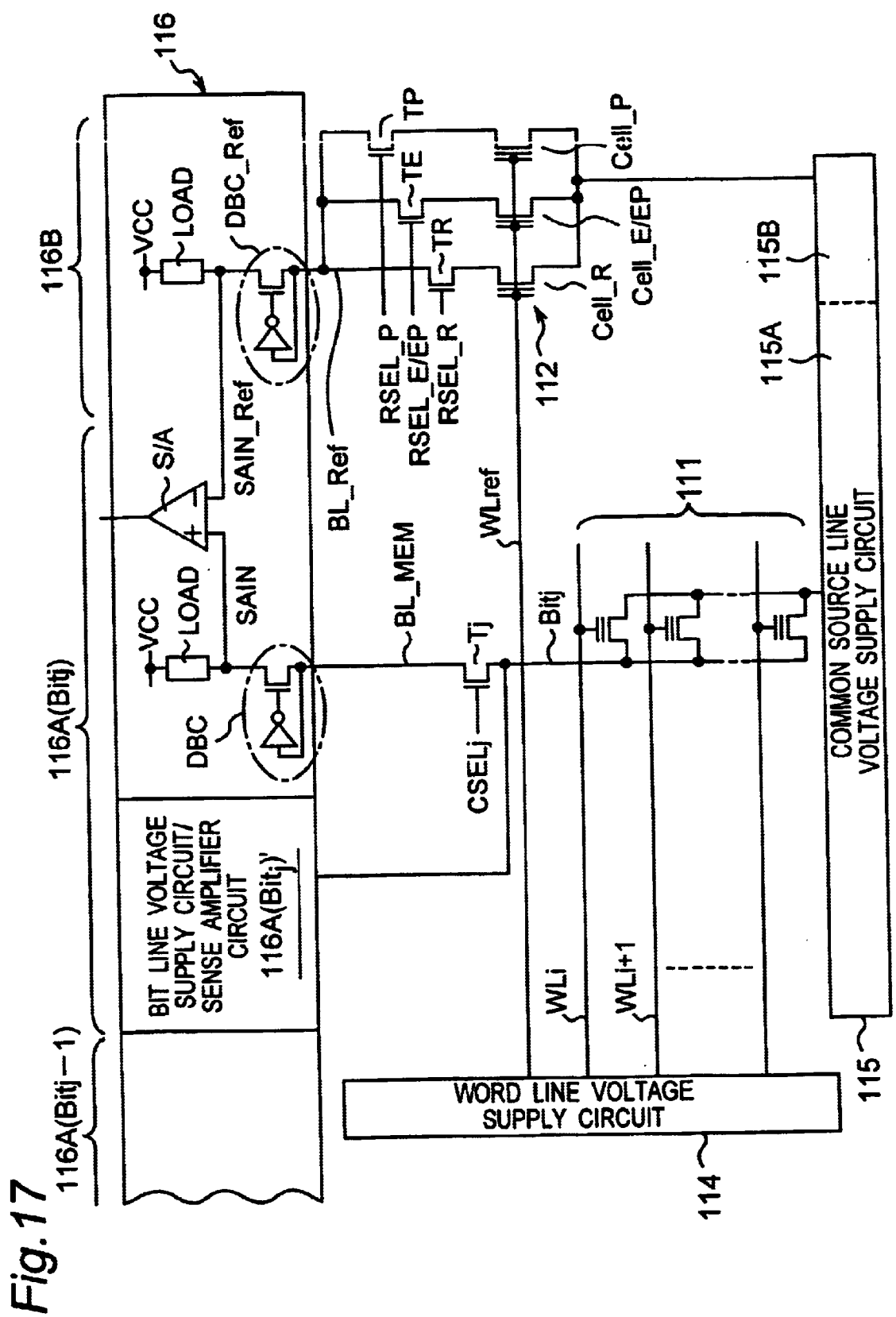
FIG. 17 is a schematic view showing a bit line voltage supply circuit/sense amplifier circuit of a flash memory suitable for using the data erase method according to the second embodiment.

FIG. 17 shows a schematic configuration of a bit line voltage supply circuit/sense amplifier circuit 116 (including 116A and 116B) and a reference cell array 112 suitable for the data erase method of the second embodiment. In this FIG. 17, a sense amplifier circuit 116A (Bitj) for 1 bit line corresponding to data region memory cells for 1 bit line Bitj and the reference cell array 112 are shown in detail. To simplify the explanation, component members corresponding to those in FIG. 16 are designated by the same reference numerals.

The reference cell array 112 includes a reference cell Cell_R for a read operation, reference cell Cell_P for verifying a write operation and reference cell Cell_E/EP for verifying both an erase operation and a write-before-erase operation, that is, commonly used as a reference cell Cell_EP for verifying a write-before-erase operation and a reference cell Cell_E for verifying an erase operation.

Since operations in the circuit shown in FIG. 17 are basically the same as in the operations of the circuit shown in FIG. 16 except that a reference cell is used as both the reference cell Cell_EP for verifying a write-before-erase operation and the reference cell Cell_E for verifying an erase operation, its explanation is omitted.

As described above, since a threshold voltage distribution after an erase operation is made compact in response to a lower voltage of a power source and a larger capacity, the present invention is effective for improvement of reliability of a nonvolatile semiconductor memory device in which a write-before-erase operation is performed. Therefore, the present invention can be easily applied to, for example, memory cell arrays of NAND-type, AND-type, NOR-type, ACT (Asymmetrical Contactless Transistor)-type and so forth, which have different memory cell array configurations.

Furthermore, the applied voltages upon the write, erase and read operations are only examples. For example, a case where a negative voltage is applied to the word line upon the erase operation is explained, but a method of applying a standard voltage of 0 V may be employed. Furthermore, a nonvolatile semiconductor memory device that stores 2 values of "1" and "0" is explained in the above description, but it is needless to say that the present invention can be similarly applied to a nonvolatile semiconductor memory device that stores multiple values such as 4 values or 8 values. Furthermore, in this embodiment, the channel write-before-erase operation and the channel erase operation utilizing the FN tunneling phenomenon are exemplified, but a write method using channel hot electrons, a write method on the drain side utilizing the FN tunneling phenomenon and an erase method using a source side can also be applied.

Furthermore, since the present invention can perform a write-before-erase operation with a very low current consumption per cell by utilizing the FN tunneling phenomenon, a write-before-erase operation can be performed in units of blocks, and time required for the write-before-erase operation can be largely reduced. Furthermore, since the write-before-erase operation is performed by implanting electrons from the channel layer into the floating gate FG via the tunnel oxide film region by utilizing the FN tunneling phenomenon, and the erase operation is performed by releasing electrons from the floating gate FG to the channel layer via the tunnel oxide film region by utilizing the FN tunneling phenomenon, the present invention contributes to improvement of reliability of a nonvolatile semiconductor memory device in ways that holes trapped in the tunnel oxide film can be released and the like.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A data erase method for a nonvolatile semiconductor memory device formed by arranging in a matrix-like array memory cells constituted by a floating gate field effect transistor to and from which data can be electrically written and erased, having:
   a step of performing a write-before-erase operation and a step of performing an erase operation for each memory cell, wherein
   a voltage application condition upon the write-before-erase operation is relaxed in comparison with a voltage application condition upon a usual write operation so that a threshold voltage distribution of memory cells after the write-before-erase operation is substantially different from a threshold voltage distribution of memory cells after the usual write operation.

2. The data erase method for a nonvolatile semiconductor memory device according to claim 1, wherein
   the step of performing a write-before-erase operation and the step of performing an erase operation are performed while referencing a threshold voltage of a reference cell for verifying a write-before-erase operation and a threshold voltage of a reference cell for verifying an erase operation, respectively, to verify a threshold voltage of each memory cell, and
   the threshold voltage of the reference cell for verifying a write-before-erase operation is set to be the same as the threshold voltage of the reference cell for verifying an erase operation or a threshold voltage of a reference cell for a read operation.

3. The data erase method for a nonvolatile semiconductor memory device according to claim 1, wherein
   the write-before-erase operation is performed by utilizing a Fowler-Nordheim phenomenon.

4. A nonvolatile semiconductor memory device formed by arranging in a matrix-like array memory cells constituted by a floating gate field effect transistor to and from which data can be electrically written and erased, having:
   means for performing a write-before-erase operation for each memory cell to erase data and means for performing an erase operation are included, wherein
   a voltage application condition used by the means for performing a write-before-erase operation is relaxed in comparison with a voltage application condition used by means for performing a usual write operation so that a threshold voltage distribution of memory cells after the write-before-erase operation is substantially different from a threshold voltage distribution of memory cells after the usual write operation.

5. The nonvolatile semiconductor memory device according to claim 4, wherein
   the means for performing a write-before-erase operation and the means for performing an erase operation verify a threshold voltage of each memory cell by referencing a threshold voltage of a reference cell for verifying a write-before erase operation and a threshold voltage of a reference cell for verifying an erase operation, respectively, and
   the threshold voltage of the reference cell for verifying a write-before-erase operation is the same as the threshold voltage of the reference cell for verifying an erase operation or a threshold voltage of a reference cell for a read operation.

6. A data erase method for the nonvolatile semiconductor memory device according to claim 4, wherein
   the write-before-erase operation is performed by utilizing a Fowler-Nordheim phenomenon.

* * * * *